United States Patent
West et al.

(10) Patent No.: US 11,662,417 B2
(45) Date of Patent: May 30, 2023

(54) ACTIVE MARKER DEVICE AND METHOD OF DESIGN THEREOF

(71) Applicant: OXFORD METRICS PLC, Yarnton (GB)

(72) Inventors: Peter West, Yarnton (GB); Miles Beattie, Yarnton (GB); Paul Smyth, Yarnton (GB); Phil Pritchett, Yarnton (GB); José Araujo, Yarnton (GB); David Reynolds, Highclere (GB)

(73) Assignee: OXFORD METRICS PLC, Yarnton (GB)

( * ) Notice: Subject to any disclaimer, the term of this patent is extended or adjusted under 35 U.S.C. 154(b) by 0 days.

(21) Appl. No.: 17/265,338

(22) PCT Filed: Aug. 1, 2019

(86) PCT No.: PCT/GB2019/052162
§ 371 (c)(1),
(2) Date: Feb. 2, 2021

(87) PCT Pub. No.: WO2020/025961
PCT Pub. Date: Feb. 6, 2020

(65) Prior Publication Data
US 2021/0318405 A1  Oct. 14, 2021

(30) Foreign Application Priority Data
Aug. 3, 2018 (GB) .................................. 1812669

(51) Int. Cl.
*G01S 1/70* (2006.01)
*F21V 9/40* (2018.01)
(Continued)

(52) U.S. Cl.
CPC .............. *G01S 1/7034* (2019.08); *F21V 5/04* (2013.01); *F21V 9/40* (2018.02); *F21V 23/003* (2013.01); *G06F 30/10* (2020.01)

(58) Field of Classification Search
CPC . G01S 1/7034; F21V 9/40; F21V 5/04; F21V 23/003; G06F 30/10
(Continued)

(56) References Cited

U.S. PATENT DOCUMENTS 5,834,759 A   11/1998 Glossop
6,603,865 B1  8/2003 Yagi et al.
(Continued)

FOREIGN PATENT DOCUMENTS

CN         203384819 U    1/2014

OTHER PUBLICATIONS

Breitemoser et al.; "A monocular vision-based system for 6D relative robot localization"; Intelligent Robots and Systems; 2011; pp. 79-85.
(Continued)

*Primary Examiner* — Bryon T Gyllstrom
(74) *Attorney, Agent, or Firm* — Foley & Lardner LLP

(57) ABSTRACT

An active marker device, and method of design thereof, for use in a motion tracking system are provided. In one arrangement, the device comprises a mounting body comprising a mounting surface. A plurality of light emitting units are mounted on respective mounting portions of the mounting surface. A control system controls the plurality of light emitting units such that light is emitted simultaneously from a selected subset of light emitting units. A plurality of optical elements are mounted on the mounting surface. Each optical element covers a different one of the light emitting units and is configured so that an inner surface of the optical element is separated from an outer surface of the light emitting unit.

(Continued)

Each optical element redirects a portion of light emitted by the light emitting unit covered by the optical element to be more parallel to the mounting portion of the light emitting unit.

7 Claims, 7 Drawing Sheets

(51) Int. Cl.
    *G06F 30/10*     (2020.01)
    *F21V 5/04*     (2006.01)
    *F21V 23/00*     (2015.01)

(58) Field of Classification Search
    USPC .......................................................... 362/235
    See application file for complete search history.

(56) References Cited

U.S. PATENT DOCUMENTS

| | | | |
|---|---|---|---|
| 9,946,343 B2 | 4/2018 | Yoon | |
| 10,720,031 B1* | 7/2020 | Cronmiller | ............... F21S 8/00 |
| 2005/0231948 A1 | 10/2005 | Pohlert et al. | |
| 2009/0122146 A1 | 5/2009 | Zalewski et al. | |
| 2009/0219715 A1* | 9/2009 | Peck | ..................... F21V 7/0008 |
| | | | 362/235 |
| 2011/0079703 A1 | 4/2011 | Gunning et al. | |
| 2011/0121734 A1* | 5/2011 | Pape | ......................... B64F 1/20 |
| | | | 315/86 |
| 2012/0068615 A1* | 3/2012 | Duong | .................... F21V 5/007 |
| | | | 313/503 |
| 2013/0106833 A1* | 5/2013 | Fun | ........................... G06T 7/73 |
| | | | 345/419 |
| 2014/0016320 A1* | 1/2014 | Shumate | ................ F21V 5/008 |
| | | | 362/269 |
| 2014/0152550 A1 | 6/2014 | Beall et al. | |
| 2016/0005174 A1* | 1/2016 | Ellsworth | .............. G06T 11/60 |
| | | | 382/103 |
| 2017/0013767 P1 | 1/2017 | Giesen | |
| 2017/0045204 A1* | 2/2017 | McNicol et al. | ....... F21V 17/14 |
| 2019/0368709 A1* | 12/2019 | Schmidt | ................. G08B 7/066 |

OTHER PUBLICATIONS

Pintaric et al.; "A rigid-body target design methodology for optical pose-tracking systems"; Proceedings of the 2008 ACM Symposium on Virtual Reality Software and Technology; 2008; pp. 73-76.

* cited by examiner

ACTIVE MARKER DEVICE AND METHOD OF DESIGN THEREOF

CROSS-REFERENCE TO RELATED APPLICATIONS

The present application claims priority under 37 U.S.C. § 371 to International Patent Application No. PCT/GB2019/052162, filed Aug. 1, 2019, which claims priority to and the benefit of GB Patent Application No. 1812669.8, filed on Aug. 3, 2018. The contents of these applications are hereby incorporated by reference in their entireties.

The invention relates to active marker devices for use in motion tracking systems, and to a method of designing active marker devices.

Motion capture and motion tracking systems are used in a wide variety of applications, from film and video game design to medical uses such as gait analysis. These systems typically work by tracking the position of markers attached to various parts of the body of a subject. Markers can be tracked optically by capturing images of the subjects using multiple cameras placed around a motion capture volume, and extrapolating the three-dimensional positions of the markers within the volume by comparing the video frames recorded by different cameras. Using the positions of the markers, and pre-existing knowledge about the placement of the cameras and of the markers on the subject's body, the motion tracking system can determine the subject's position and posture as a function of time.

Broadly, the markers used can be divided into passive markers and active markers. Passive markers reflect light emitted from light sources around the motion capture volume, appearing bright in the captured images so they can be easily identified. Active markers emit light themselves, enabling them to be identified in the captured images.

A problem with motion tracking systems using optical markers is that the cameras of the motion tracking system can lose track of markers. This could be due to markers becoming occluded, either by objects within the motion capture volume or parts of a subject's body. Markers may also face away from a particular camera, so that light emitted by or reflected from the markers cannot reach that camera. This means that a marker may only be visible to a subset of the cameras for some or all of the recording time, which in turn reduces the accuracy with which the position of that marker can be determined. In addition, when a marker becomes visible again to a particular camera, it may take several frames for the motion tracking system to identify the marker in the video from that camera and be able to resume using its position in determining the subject's position and posture. This further reduces the accuracy and performance of the motion tracking system.

These problems can be addressed by providing more cameras and more markers in the motion tracking system. This means that a sufficient number of markers is more likely to be continuously visible to sufficiently many cameras for motion tracking of the subject to be performed accurately and reliably. However, providing more cameras and markers increases the cost of the system, and the time required for set up of a motion tracking session. It would therefore be desirable to provide a way to address these problems without an increase in the number of cameras and markers required.

It is an object of the invention to provide an improved active marker device for use in motion tracking systems.

According to a first aspect of the invention, there is provided an active marker device for use in a motion tracking system comprising: a mounting body comprising a mounting surface; a plurality of light emitting units, each light emitting unit being mounted on a respective mounting portion of the mounting surface; a control system configured to control the emission of light by the plurality of light emitting units, wherein the control system is configured to select a subset of the light emitting units, and control the plurality of light emitting units such that light is emitted simultaneously from the selected subset of light emitting units while the remaining light emitting units do not emit light; and a plurality of optical elements mounted on and protruding above the mounting surface, each optical element having an inner surface and an outer surface, wherein: each optical element covers a different one of the light emitting units and is configured so that the inner surface of the optical element is separated from an outer surface of the light emitting unit; and each optical element is configured to redirect at least a portion of light emitted by the light emitting unit covered by the optical element in such a way as to be more parallel to the mounting portion on which the light emitting unit is mounted.

The optical elements ensure emitted light is spread efficiently over a wide range of angles. Thus a device is provided which allows the marker to be robustly identified over a wide range of angles and positions. This reduces the likelihood of the marker becoming occluded from cameras of the motion tracking system. Emitting light from a subset of the light emitting units allows the device to produce different patterns of light. This enables multiple devices placed on the same subject to be uniquely identified by the motion tracking system.

In an embodiment, the inner surface of each optical element and the mounting portion of the light emitting unit covered by the optical element together form a closed volume enclosing the light emitting unit. Thus the construction of the device is simplified, and the optical elements can also provide protection for the light emitting units.

In an embodiment, each of one or more of the optical elements comprises a filter. Thus the wavelengths of light emitted by the device can be more easily controlled, allowing the marker to be more robustly identified by the cameras. The filter may also perform an aesthetic function in allowing the light emitting units to appear a particular colour on the device.

In an embodiment, the control system is configured to pulse the light emitting units. Thus the markers may also be configured to only switch on in synchronisation with the capturing of frames by the cameras of the motion tracking system. This reduces the time the light emitting units are activated, thereby reducing the power consumption of the device. This also allows the light emitters to be made brighter while retaining a lower power consumption, thereby increasing the range over which they can be seen.

According to a second aspect of the invention, there is provided an active marker device for use in a motion tracking system comprising: a mounting body comprising a mounting surface; at least four light emitting units, each light emitting unit being mounted on a respective mounting portion of the mounting surface; and a control system configured to control the emission of light by the plurality of light emitting units, wherein the control system is configured to select a subset of at least three of the light emitting units, and control the plurality of light emitting units such that light is emitted simultaneously from the selected subset of light emitting units while the remaining light emitting units do not emit light; wherein an arrangement of the light emitting units on the mounting surface is such that a spatial pattern formed by the selected subset of light emitting units is distinguishable from a spatial pattern formed by any other possible subset of at least three light emitting units for all possible translations and rotations of the device.

Thus a device is provided where the possible patterns of light emitted by the device are easily distinguishable from one another. This means that if multiple devices are used, each device can be uniquely identified by the spatial pattern of light emitting units in a single frame captured by the cameras. Therefore the system does not rely on other identification methods such as temporal coding of pulses from the marker, and the position of a marker can be more rapidly re-established after a period in which it was occluded.

In an embodiment the pattern formed by the selected subset of light emitting units is distinguishable from itself under all possible translations or rotations of the device. Thus a device is provided where not only the position but also the orientation of a marker can be rapidly identified in captured images from cameras of the motion tracking system.

In an embodiment the number of light emitting units and the arrangement of the light emitting units on the mounting surface is such that at least 5 different spatial patterns can be formed by subsets of at least three light emitting units. Thus a device is provided such that several distinguishable patterns are possible, allowing multiple marker devices to be used simultaneously and be easily distinguished from each other.

According to a third aspect of the invention, there is provided a computer-implemented method of designing an active marker device for use in a motion tracking system, wherein the active marker device comprises: a mounting body, the mounting body comprising a mounting surface; and at least four light emitting units mounted on the mounting surface, wherein the method comprises the steps of: a) selecting an initial set of positions of the light emitting units on the mounting surface; b) determining a self-similarity of the initial set of positions; c) altering the initial set of positions to produce a perturbed set of positions; d) determining a self-similarity of the perturbed set of positions; e) choosing the initial set of positions or the perturbed set of positions as a new initial set of positions, based on a comparison between the determined self-similarity of the initial set of positions and the determined self-similarity of the perturbed set of positions; and f) repeating steps c) to e) until a predetermined end condition is satisfied.

Thus a method is provided whereby the distinguishability of the possible patterns produced by the device can be optimised. The method allows the positions of light emitters to be optimised efficiently for different shapes of marker device and different numbers of light emitters.

In an embodiment step a) comprises selecting the initial set of positions of the light emitting units such that a minimum distance between each pair of light emitting units is above a predetermined threshold. Thus a method is provided whereby the optimisation of positions can take account of constraints on the placement of the light emitters. This simplifies the design process in the case that other features are present on the mounting surface of the marker.

In an embodiment the determining of the self-similarity of a set of positions in steps b) and d) comprises: selecting a first subset of C positions of light emitting units from the set of positions, where C is a positive integer; selecting a second subset of C positions of light emitting units from the set of positions; and determining a similarity of the two subsets. Thus a method is provided whereby the distinguishability of subsets of light emitters is optimised. This helps to prevent misidentification of different subsets when multiple devices are used simultaneously in the same motion tracking system.

In an embodiment step e) comprises choosing the perturbed set of positions if the determined self-similarity of the perturbed set of positions is less than or equal to the determined self-similarity of the initial set of positions. Thus a method is provided whereby the distinguishability of the sets of positions is improved iteratively. This provides an efficient and easily implemented process for optimisation.

In an embodiment step e) comprises choosing the perturbed set of positions with a probability dependent on the difference between the determined self-similarity of the initial set of positions and the determined self-similarity of the perturbed set of positions, if the determined self-similarity of the perturbed set of positions is greater than the determined self-similarity of the initial set of positions. Thus a method is provided where the optimisation process does not always follow the local gradient in the change of distinguishability as a function of position. This increases the chance that the optimisation obtains the global maximum distinguishability, rather than a local maximum distinguishability.

In an embodiment step e) comprises choosing the initial set of positions if the distance between any pair of positions in the perturbed set of positions is below a predetermined threshold. Thus a method is provided where light emitters are not placed too closely together, and can always be resolved as separate light emitters by the cameras of the motion tracking system.

Embodiments of the invention will now be described, by way of example only, with reference to the accompanying drawings in which corresponding reference symbols represent corresponding parts, and in which.

In the figures and the embodiments described below, the features of the first and second aspects of the invention are provided in combination in the same active marker device. The embodiments illustrated herein therefore combine the advantages of improved visibility of the light emitters provided by the first aspect, with the advantages of improved distinguishability provided by the second aspect. However, it is not necessary to provide these features in combination, and they may instead be provided separately if desired. The method provided by the third aspect of the invention may be used to design an active marker device according to the second aspect of the invention. The method may also be used to produce improved designs of other active marker devices.

Figure 1:
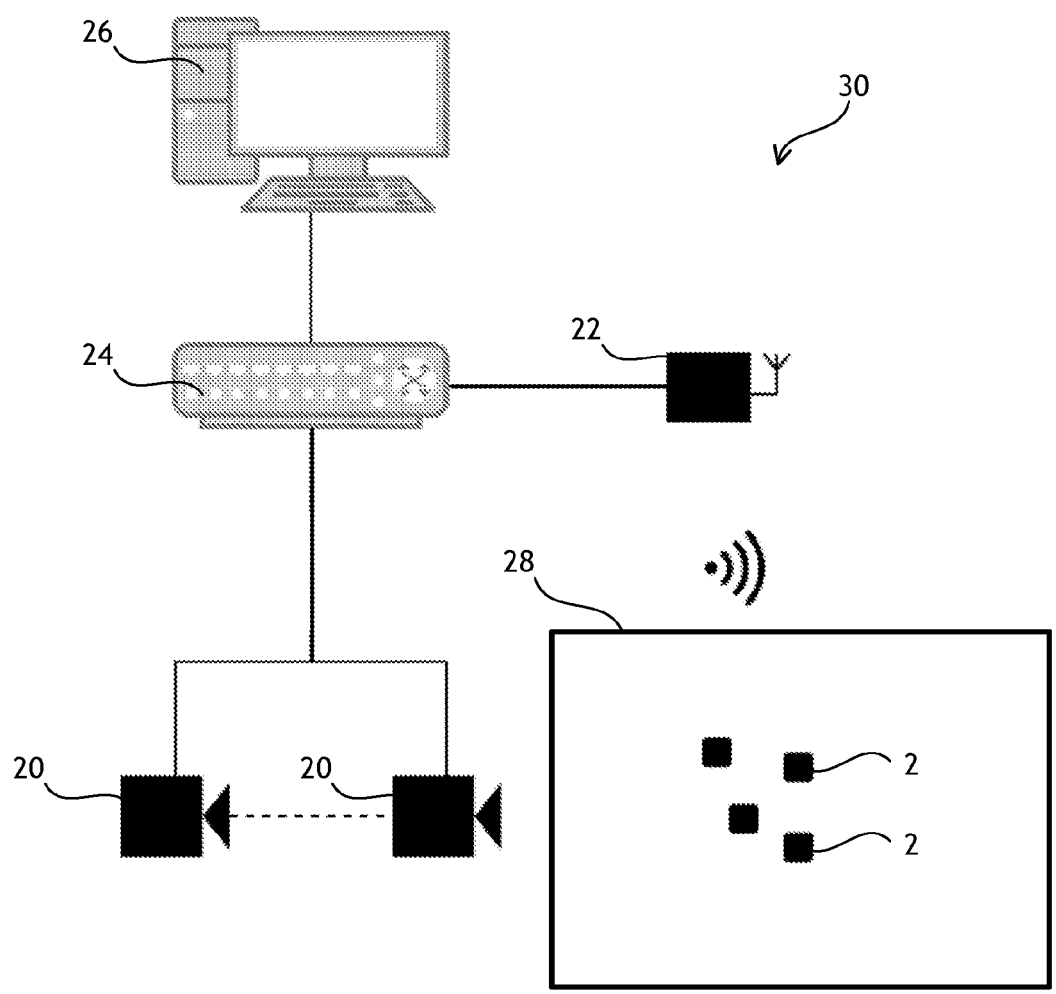
FIG. 1 is an illustration of an example motion tracking system.
Figure 2:
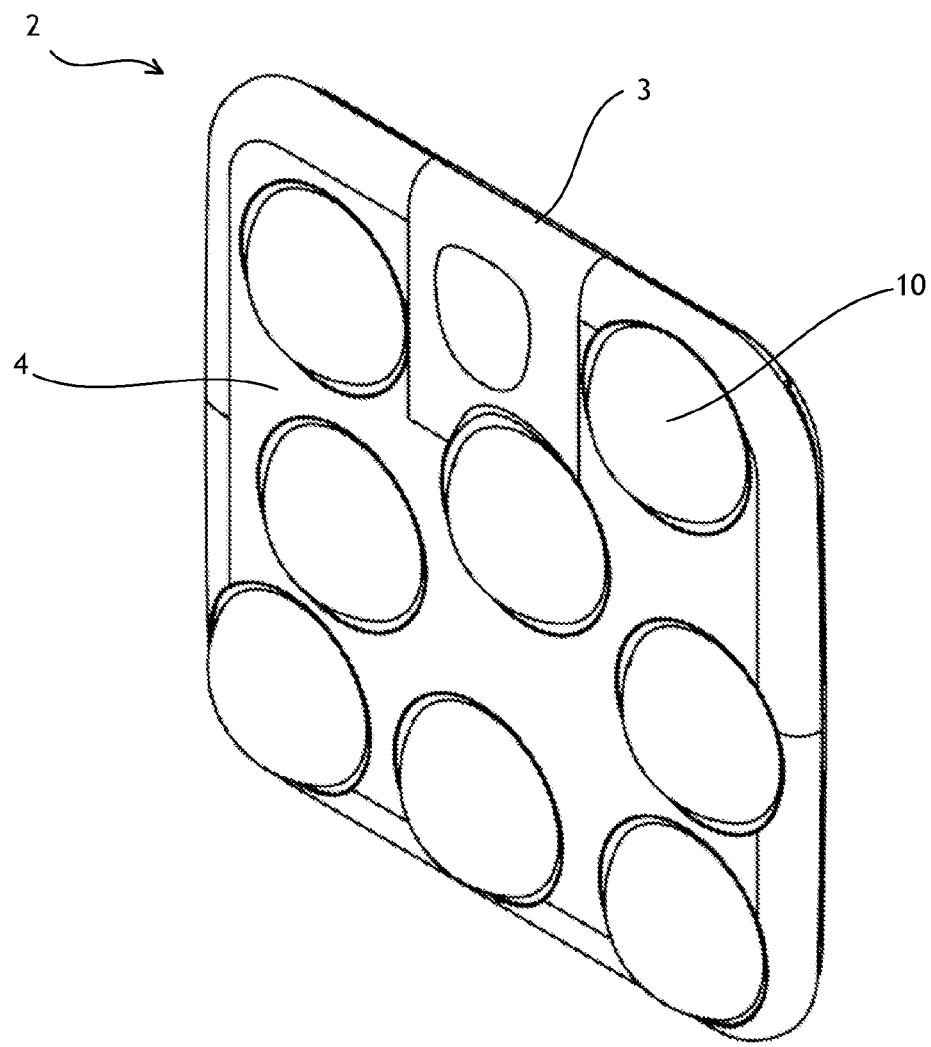
FIG. 2 is an isometric view of an embodiment of the first and second aspects of the invention.
Figure 3:
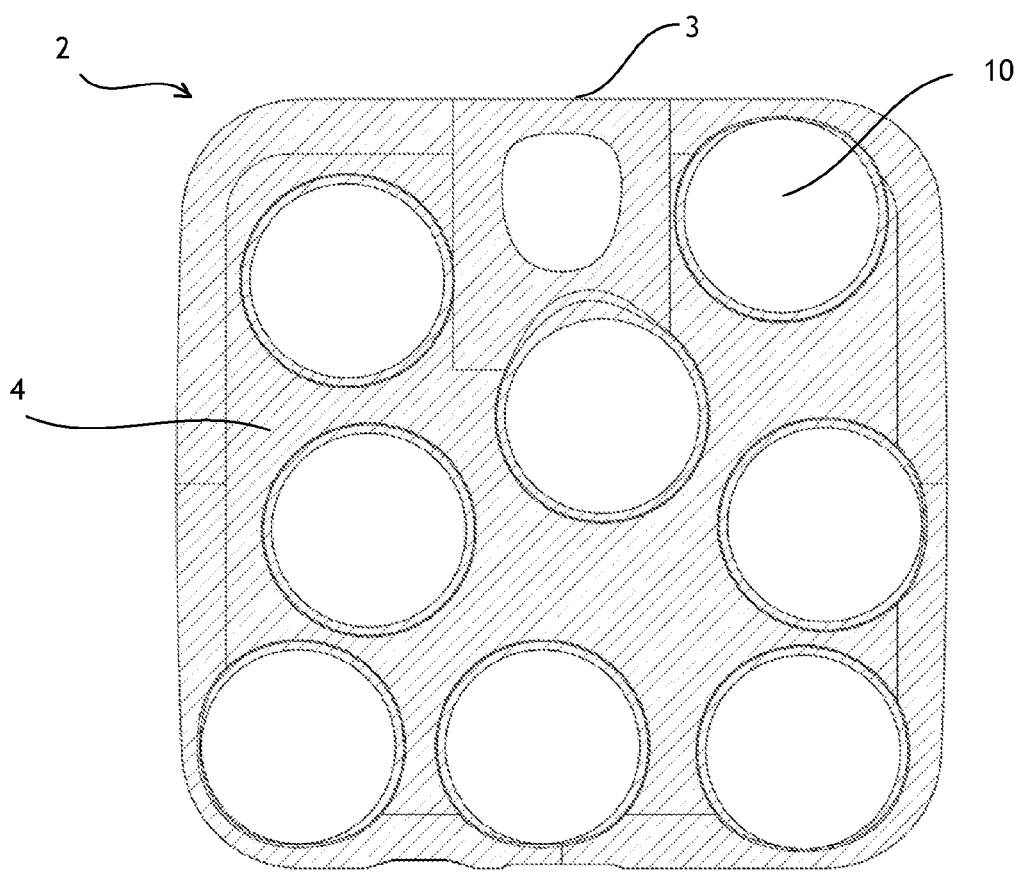
FIG. 3 is a top-down view of the embodiment of FIG. 2.
Figure 4:
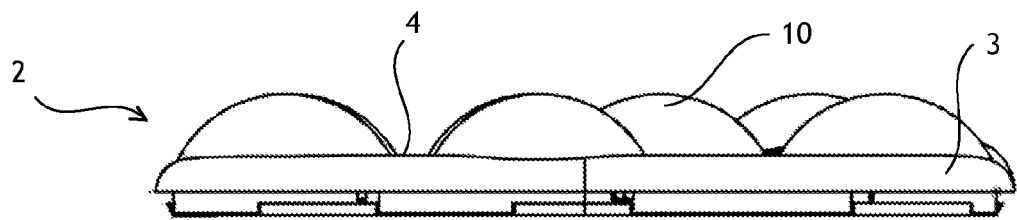
FIG. 4 is a side view of the embodiment of FIG. 2.
Figure 5:
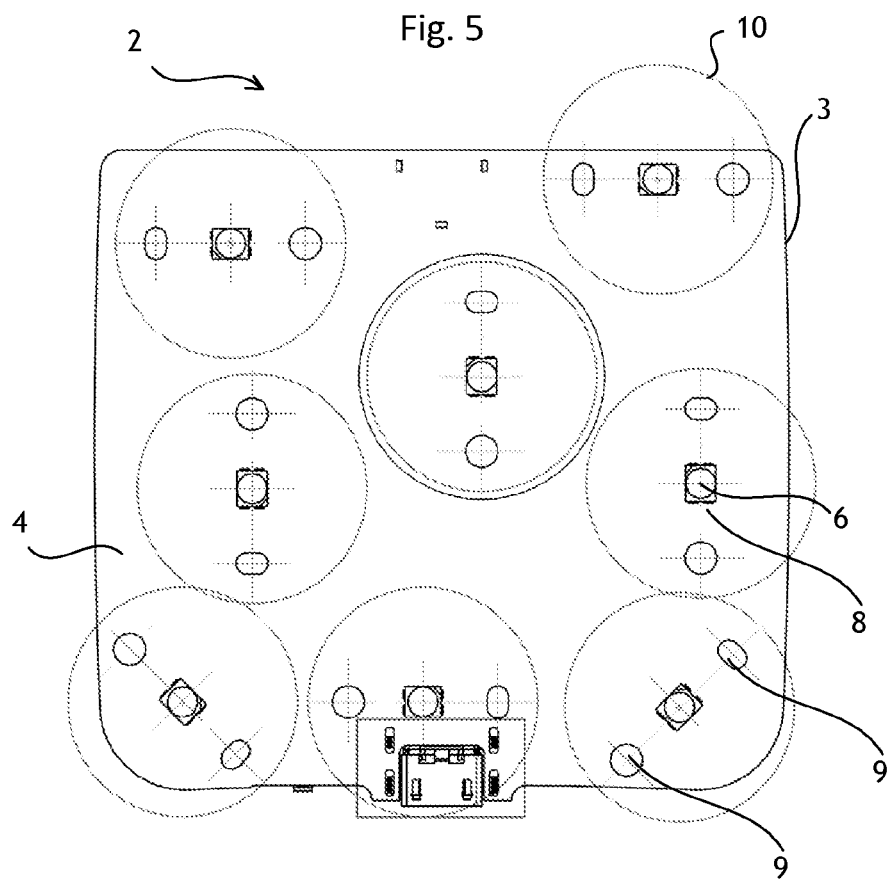
FIG. 5 is a top-down cutaway view of the embodiment of FIG. 2.

An active marker device 2 is provided for use in a motion tracking system 30. An example motion tracking system is shown in FIG. 1. The example motion tracking system 30 comprises a plurality of cameras 20, a transceiver 22, a controller 24, a computer 26, and a plurality of active marker devices 2 placed within a motion capture volume 28. The transceiver 22 is used for wirelessly synchronising operation of different components of the motion tracking system 30. The cameras 20 record video of the motion capture volume 28. The cameras 20 may perform processing on the video, for instance by thresholding the images to compress them and reduce the amount of data used to represent each image. The video is transmitted to the controller 24 and the computer 26. The computer 26 carries out processing on each of the frames of video captured by each of the cameras 20. By doing so, the computer 26 can calculate the positions of each of the marker devices 2 within the motion capture volume 28.

An embodiment of an active marker device 2 is shown from different viewing angles in FIGS. 2-5. The active marker device 2 comprises a mounting body 3. The mounting body 3 is formed from any suitable material, such as plastic or metal. The mounting body 3 comprises a mounting surface 4. The mounting body 3 may have any shape suitable for the application to which the active marker device 2 is to be applied. For example, the mounting body 3 may be a small regular shape (e.g. a square) to make it easy to handle, transport and store. Alternatively, the mounting body 3 may conform to the shape of a limb or portion of a body in order to make it easy to secure to a subject and/or increase comfort of the subject while in use. As a further alternative, the mounting body 3 may be shaped as another type of object, for example a gun or sword, which may be of particular interest when a motion tracking system is used for film or video game design.

The mounting surface 4 is any suitable surface of the mounting body 3. In different embodiments, the mounting surface can have a variety of different shapes and sizes. In an embodiment, the mounting surface 4 is planar. In another embodiment, the mounting surface 4 is curved.

The device 2 further comprises a plurality of light emitting units 6, each light emitting unit 6 being mounted on a respective mounting portion 8 of the mounting surface 4. In an embodiment, each of one or more of the light emitting units 6 comprises a light-emitting diode (LED). LEDs are efficient light emitters, and consume less power than other light emitters of comparable brightness. In an embodiment, the active marker device 2 is battery-powered, and comprises a battery to supply power to the light emitting units 6. The use of LEDs as light emitters is particularly advantageous in this embodiment, because it extends the time the device 2 can be used between charges of the battery. In an embodiment, each of one or more of the light emitting units 6 is configured to emit predominantly infra-red light. Infrared light can be detected by typical camera systems, but is not visible to human subjects. This makes the use of infra-red light less intrusive and/or distracting for the subject being tracked, or for the operators of the motion tracking system 30. In an embodiment, the device 2 comprises at least four light emitting units 6, optionally at least six light emitting units 6, optionally at least eight light emitting units 6.

In an embodiment, each light emitting unit 6 comprises a light generating component configured to generate light, and a transmissive encapsulating member, integral with and enclosing the light generating component. The transmissive encapsulating member may protect the light generating component during delivery and assembly of the active marker device 2. In an embodiment, the transmissive encapsulating member also provides optical functionality, for example spreading the light from the light generating component so that the spread of light provided by the combination of the transmissive encapsulating member and the optical element is further improved. In an embodiment, the light generating component comprises an LED.

In an embodiment the mounting portion 8 of one of the light emitting units 6 is coplanar with the mounting portion of at least one other light emitting unit 6. Optionally, the mounting portion 8 of each light emitting unit 6 is coplanar with the mounting portion 8 of every other light emitting unit 6. Mounting the light emitting units 6 on a planar surface can simplify the construction of the active marker device 2.

The device 2 further comprises a plurality of optical elements 10. Each optical element 10 covers a different one of the plurality of light emitting units 6 mounted on respective mounting portions 8 of the mounting surface 4. The optical elements 10 are formed from any suitable material, such as glass or plastic, which is transparent to light of desired wavelengths. In an embodiment the optical elements 10 comprise polycarbonate.

The optical elements 10 are mounted on the mounting surface 4 to cover the light emitting units 6. In an embodiment, the optical elements 10 are mounted on the mounting surface 4 using insert moulding. In an embodiment, the optical element comprises pegs 17 that can be inserted into holes 9 in the mounting surface 4 to locate the optical elements 10 relative to the light emitting units 6. This ensures that the optical elements 10 are positioned correctly relative to the light emitters 6, and simplifies the assembly of the device 2. In an embodiment, the optical elements are each mounted separately onto the mounting surface. In an alternative embodiment, one or more optical elements may be integrated into a single component which is mounted on the mounting surface. This allows multiple optical elements to be mounted simultaneously, reducing the complexity of the manufacturing process.

Figure 6:
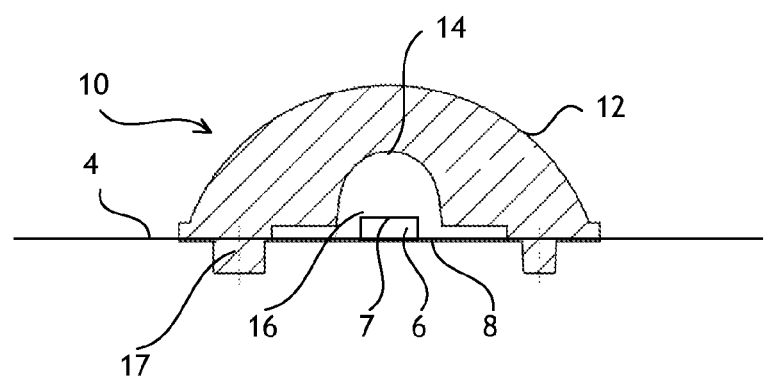
FIG. 6 is a side view of an optical element used in embodiments of the invention.

FIG. 6 shows an example of an optical element 10 covering a light emitting unit 6. The light emitting unit 6 is mounted on a mounting portion 8 of the mounting surface 4, and has an outer surface 7. The optical element 10 has an inner surface 14 and an outer surface 12. The optical element 10 is configured so that the inner surface 14 of the optical element is separated from the outer surface 7 of the light emitting unit. In an embodiment, for all directions of viewing parallel to the mounting surface 4 at least two of the optical elements 10 overlap with each other.

Figure 7:
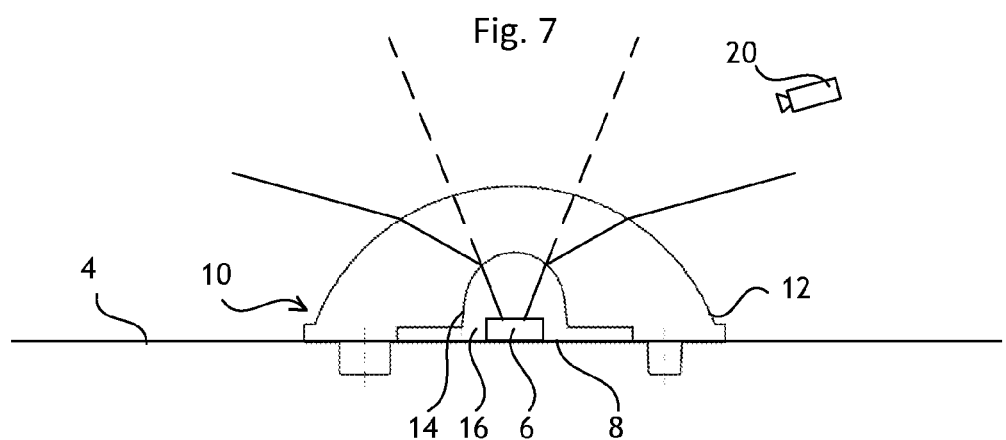
FIG. 7 is a second side view of an optical element used in embodiments of the invention.

As shown in FIG. 7, each optical element 10 is configured to redirect at least a portion of the light emitted by the light emitting unit 6 covered by the optical element 10 to be more parallel to the mounting portion 8 on which the light emitting unit 6 is mounted. Therefore the light emitted from the light emitting unit 6 is spread out so that a larger proportion of the light is distributed over a larger range of angles than if no optical element 10 was present.

When the active marker device 2 is used in a motion tracking system 30, the light from the light emitting units 6 must reach several of the cameras 20 of the motion tracking system 30 in order for the position and orientation of the active marker device 2 to be determined. Spreading out the light from the light emitting units 6 allows the active marker device 2 to be detected over a larger range of angles and positions relative to any given camera 20. In the example of FIG. 7, without the optical element 10, light from the light emitting unit 6 would be spread over the region illustrated by the dashed lines. Without the optical element 10, the camera 20 would not be able to detect the light emitted by the active marker device 2. With the optical element 10, light is spread over the region illustrated by the solid lines. Therefore, the camera 20 is able to detect the active marker device 2.

This feature helps to solve the problem of losing track of marker devices because it allows the active marker device 2 to be detected by a given camera 20 for a larger range of orientations of the active marker device 2 relative to the camera 20. This reduces the likelihood that a particular camera 20 will lose track of the marker device 2. This in turn means the active marker device 2 can be tracked for a greater proportion of time during the motion tracking period, improving the accuracy of the determination of its position and orientation. It also means fewer cameras 20 are necessary in the motion tracking system to provide a given level of accuracy, because the markers are visible to each camera 20 for a larger proportion of the time.

In an embodiment, each of one or more of the optical elements 10 is configured to redirect light emitted by the light emitting unit 6 covered by the optical element 10 in such a way as to increase the size of the smallest solid angle that contains 50% of the total light emitted by the light emitting unit 6, relative to the distribution of light propagating between the light emitting unit and the inner surface of the optical element 10. In an embodiment, each of one or more of the optical elements 10 is configured to redirect light emitted by the light emitting unit 6 covered by the optical element 10 in such a way that a smallest solid angle containing 50% of the total light emitted by the light emitting unit is larger than $\pi/2$ steradians, optionally larger than $\pi$ steradians, optionally larger than $3\pi/2$ steradians, optionally larger than 6 steradians.

The spread of light from the optical elements 10 may also be characterised using a full-width at half maximum (FWHM) of the light distribution as a function of angle outside the optical elements 10. The FWHM of a distribution of the intensity of the light exiting the optical element 10 as a function of angle away from a normal to the mounting portion 8 of the respective light emitting unit 6 may be larger than 60 degrees, optionally larger than 90 degrees, optionally larger than 120 degrees, optionally larger than 150 degrees.

In an embodiment, the inner surface 14 of each optical element 10 and the mounting portion 8 of the light emitting unit 6 covered by the optical element 10 together form a closed volume 16 enclosing the light emitting unit 6. Such an arrangement can protect the light emitting unit 6 by preventing damage from impact, or ingress of liquid or dirt.

In an embodiment, each of one or more of the optical elements 10 comprises a filter. The filter is an optical filter which absorbs some wavelengths of light and transmits other wavelengths of light. In an embodiment, the filter is a coating on one of the surfaces of the optical element 10, optionally the outer surface 14. In an embodiment, the material of the optical element 10 is chosen to intrinsically filter light. Optionally, the filter is configured to pass infrared light in preference to other wavelengths of light. This can provide an aesthetic effect by concealing the light emitter 6. It also allows the light emitted from the device 2 to be restricted to a particular range of wavelengths even if the light emitting unit 6 emits light over a wider range of wavelengths.

The device 2 further comprises a control system configured to control the emission of light by the plurality of light emitting units 6, wherein the control system is configured to select a subset of the light emitting units 6, and control the plurality of light emitting units 6 such that light is emitted simultaneously from the selected subset of light emitting units 6 while the remaining light emitting units 6 do not emit light. By selecting only a subset of light emitting units 6 to emit light, the device 2 can produce different patterns by illuminating different subsets of light emitters 6. This allows multiple devices 2 to be used simultaneously on the same subject in the same motion tracking system 30. The devices 2 are distinguishable from one another to the cameras 20 of the motion tracking system because the control system of each device 2 selects a different subset of light emitters 6.

In an embodiment, the control system is configured to pulse the light emitting units 6. Pulsing the light emitting units 6 can be used as an alternative means of identifying different devices 2 using temporal coding of the pulsing. Pulsing can also be used to synchronise the time the light emitter 6 is emitting light with the timing of frames captured by cameras 20 of the motion tracking system 30. This conserves power by switching on the light emitters 6 only when they need to be active to be detected by the cameras 20. In an embodiment, the control system controls pulsing of the light emitting units 6 based on an external signal. In an embodiment, the external signal is provided by the motion tracking system 30. This allows the pulsing of the light emitting units 6 to be synchronised with other aspects of the operation of the motion tracking system, such as the timing of frames captured by cameras 20 of the motion tracking system. In an embodiment, the device 2 further comprises a radio-frequency receiver for receiving the external signal from an external source. Radio-frequency receivers are well-developed and widely available, making them easy to integrate into a device. The external signal may comprise other types of signal, either instead of or in combination with radio-frequency signals, for example, Bluetooth Wi-Fi, or optical signals. In such an embodiment, the device 2 comprises one or more receivers suitable for receiving the appropriate types of signal.

In an embodiment, the external signal is also used to coordinate the selection of subsets of light emitting units 6 by the control system. The external signal can be used to ensure that the control systems of different ones of the active marker device 2 used in the same motion tracking system 30 choose different subsets of light emitting units 6. This ensures that all of the devices 2 are distinguishable from one another.

As discussed above, part of the problem with losing track of markers in a motion tracking system is that it can take several frames of video to identify a marker when it becomes visible again to a particular camera. This reduces the number of frames that can be used to track the position of a marker, reducing the accuracy of subject position determination. In real-time applications, where the position of a subject is calculated and reported in real-time, this increases latency and reduces performance. In offline applications, where processing is done after data collection, this reduces accuracy and reliability of subject position determination.

An embodiment of the active marker device 2 allows markers to be more rapidly identified by having carefully chosen arrangements of light emitting units 6 on the mounting surface 4. Therefore, in an embodiment where the device 2 comprises at least four light emitting units 6, an arrangement of the light emitting units 6 on the mounting surface 4 is such that a spatial pattern formed by a subset of at least three light emitting units 6 is distinguishable from a spatial pattern formed by any other possible subset of at least three light emitting units 6 for all possible translations and rotations of the device.

This distinguishability means that a device 2 can be distinguished from another similar device 2 in use in the same motion tracking system 30 using only a single frame of video. Therefore the position of the marker can be reacquired by a particular camera 20 of the motion tracking system 30 as quickly as possible after a period in which the marker was not visible to that camera.

In an embodiment, the pattern formed by a subset of light emitting units 6 is also distinguishable from itself under all possible translations or rotations of the device. This means that not only the identity but also the orientation of the device 2 can be reacquired using only a single frame of video.

The distinguishability of subsets of the light emitting units 6 is due in part to an arrangement of the light emitting units on the mounting surface 4 with very little symmetry. This means it is less likely that a first subset of light emitting units 6 will resemble a second subset of light emitting units 6 under a rotation or translation of the device. In an embodiment, the arrangement of the light emitting units 6 on the mounting surface 4 has fewer than three symmetries, optionally fewer than two symmetries. In an embodiment, the arrangement of the light emitting units 6 on the mounting surface 4 has no rotation symmetry other than the identity. In an embodiment, the arrangement of the light emitting units 6 on the mounting surface 4 has no reflection symmetry other than the identity.

The chance of misidentification can be reduced by configuring the control system to select subsets of light emitting units 6 forming a pattern without a particular symmetry. In an embodiment, the control system is configured to select the subset of light emitting units 6 such that a pattern formed by the selected subset has no reflection symmetry other than the identity. In an embodiment, the control system is configured to select the subset of light emitting units 6 such that a pattern formed by the selected subset has no rotation symmetry other than the identity.

It is desirable to be able to use several of the active marker devices 2 in the same motion tracking system 30. Therefore, each device 2 must be able to form a plurality of distinguishable spatial patterns using subsets of the light emitting units 6. In an embodiment, the number of light emitting units 6 and the arrangement of the light emitting units 6 on the mounting surface 4 is such that at least 5 different spatial patterns can be formed by subsets of at least three light emitting units 6, optionally at least 10 different spatial patterns, optionally at least 20 different spatial patterns, optionally at least 40 different spatial patterns.

Figure 8:
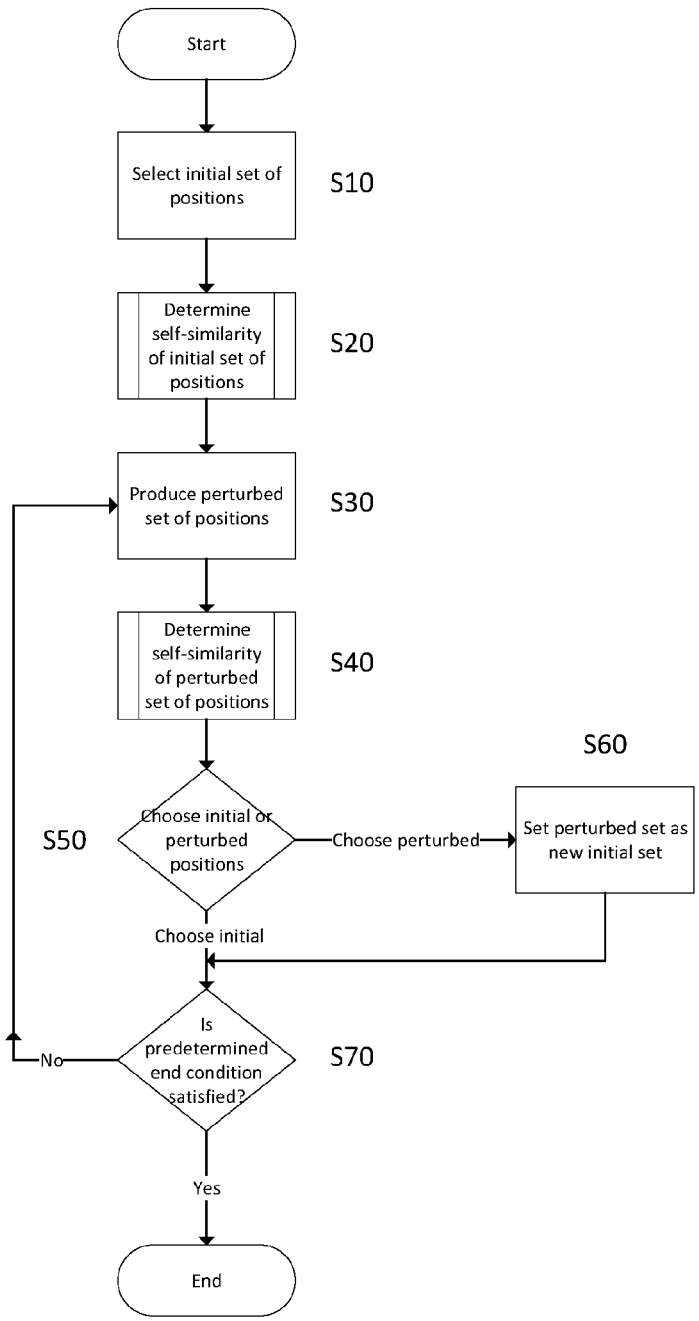
FIG. 8 is a flow chart illustrating steps in an embodiment of the third aspect of the invention.

The distinguishability of different spatial patterns formed by subsets of the light emitting units 6 can be improved by using an iterative design method according to a third aspect of the disclosure. FIG. 8 shows a flowchart summarising the method. The method provides for computer-implemented design of an arrangement of light emitting units 6 on the mounting surface 4 of an active marker device 2. The method comprises selecting in step S10 an initial set of positions of the light emitting units 6 on the mounting surface 4, and determining in step S20 a self-similarity of the initial set of positions. The initial set of positions is perturbed in step S30 to produce a perturbed set of positions, and a self-similarity of the perturbed set of positions determined in step S40. One of the initial or perturbed set of positions is then chosen in steps S50 and S60 as a new initial set of positions, based on a comparison of the self-similarity of the initial and perturbed set of positions. The perturbing of the initial set of positions, determining of a self-similarity of the perturbed set of positions, and choosing of one of the initial and perturbed set of positions is then repeated until a predetermined end condition is satisfied. Each set of positions defines an arrangement of the light emitting units 6 on the mounting surface 4. It is not necessary to repeat the determination of the self-similarity of the initial set of positions. This is because it will already be known, either as the self-similarity of the original initial set, or as the self-similarity of a previous perturbed set.

By gradually changing the arrangement of the light emitting units 6 in this way, the distinguishability of the arrangement of light emitting units 6 can be optimised. This maximises the distinguishability of subsets of the light emitting units so that many different subsets can be chosen while the device 2 is in use, with a reduced chance of any subset being mistaken for another subset. Further, the method can be efficiently implemented on a computer and applied to any number of light emitting units 6 on any mounting surface 4 regardless of its shape or size.

In an embodiment, each position of a light emitting unit 6 comprises a three-dimensional set of coordinates. In an embodiment, these are coordinates in a three-dimensional model of the active marker device. In an embodiment, the initial set of positions is chosen from a mesh of allowable positions of the light emitting units 6 on the mounting surface 4. The mesh of allowable positions is obtained using a three-dimensional model of the mounting surface 4 divided into a mesh of points. Viable positions of light emitting units 6 on the mounting surface 4 are identified based on relevant structural considerations. A mesh of allowable positions of light emitting units 6 on the mounting surface 4 is then chosen as a subset of points in the mesh of points on the mounting surface 4.

For example, it may not be possible to mount a light emitting unit 6 on a portion of the mounting surface 4 which is too tightly curved. In this case, points in the mesh of points on the mounting surface 4 with high curvature of the mounting surface 4 would not be included in the mesh of allowable positions for light emitting units 6. Similarly, in an embodiment including optical elements, as described above, it may be necessary to have a certain space around a light emitting unit 6 in order to mount the optical element 10 on the mounting surface 4. Therefore, points in the mesh of points on the mounting surface 4 that are too close to the edge of the mounting surface 4, or too close to other features on the mounting surface 4 may not be included in the mesh of allowable positions of light emitting units 6.

Other considerations may be made in choosing the initial set of positions. Cameras often require a minimum distance between light emitting units 6 to distinguish them as separate points, rather than a single light source. In an embodiment, the initial set of positions is chosen such that the minimum distance between any pair of light emitting units 6 is above a predetermined threshold. This ensures that each light emitting unit 6 is distinguishable from every other light emitting unit 6 on the same active marker device 2. In an embodiment, this may be achieved by choosing a set of positions, and checking that the minimum distance between each possible pair of light emitting units 6 is above the predetermined threshold. If any of the minimum distances are below the predetermined threshold, a new set of initial positions is chosen, otherwise the set of positions is accepted as the initial set of positions. The predetermined threshold may be chosen based on considerations such as the resolution of the cameras 20 in the motion tracking system 30, or a typical distance of the active marker devices 2 from the cameras 20 during use. Such considerations will determine the minimum separation of features required for the camera 20 to resolve two light emitting units 6 as separate light emitting units 6.

Similar principles can be applied when the initial set of positions is altered to produce the perturbed set of positions. In an embodiment, the perturbed positions are positions selected from a mesh of allowable positions of the light emitting units 6 on the mounting surface 4. This ensures that the method does not place light emitting units 6 in unsuitable positions on the mounting surface 4.

In an embodiment, the perturbed set of positions is produced from the initial set of positions by moving one or more of the light emitting units 6 from its current position to a neighbouring position in the mesh of allowable positions. Each of one or more of the positions in the initial set of positions is changed to a different allowable position which is adjacent to the initial position. The new position is chosen from points in the mesh of allowable positions. In this embodiment, the positions of the light emitting units 6 are changed gradually between each repetition. This can allow the arrangement to be improved incrementally.

In an embodiment, the perturbed set of positions is produced from the initial set of positions by moving one or more of the light emitting units 6 from its current position to a random position in the mesh of allowable positions. The new position is chosen from points in the mesh of allowable positions, but could be any allowable position. This embodiment allows larger changes in the arrangement of light emitting units 6, and can help to avoid local minima in the optimisation process.

In an embodiment, every position in the initial set of positions is moved to produce the perturbed set of positions.

Moving initial positions to neighbouring positions can be combined with moving initial positions to random positions. In an embodiment, a subset of initial positions are moved to neighbouring allowable positions, and a different subset of initial positions are moved to random allowable positions in the same step of the method. In an embodiment, initial positions are moved to random positions at first, and moved to neighbouring positions in later repetitions. This allows the method to sample a large variety of different configurations early in the method, and then optimise the most promising configuration later in the method.

A self-similarity score is used to characterise the self-similarity of a set of positions. A similarity score calculated in a similar manner can also be used to compare the similarity of two different sets of positions. The similarity metric measures how easily subsets of a first set of positions may be distinguished from subsets of a second set of positions. In the case of measuring a self-similarity, the comparison is between different subsets of the same set of positions.

Figure 9:
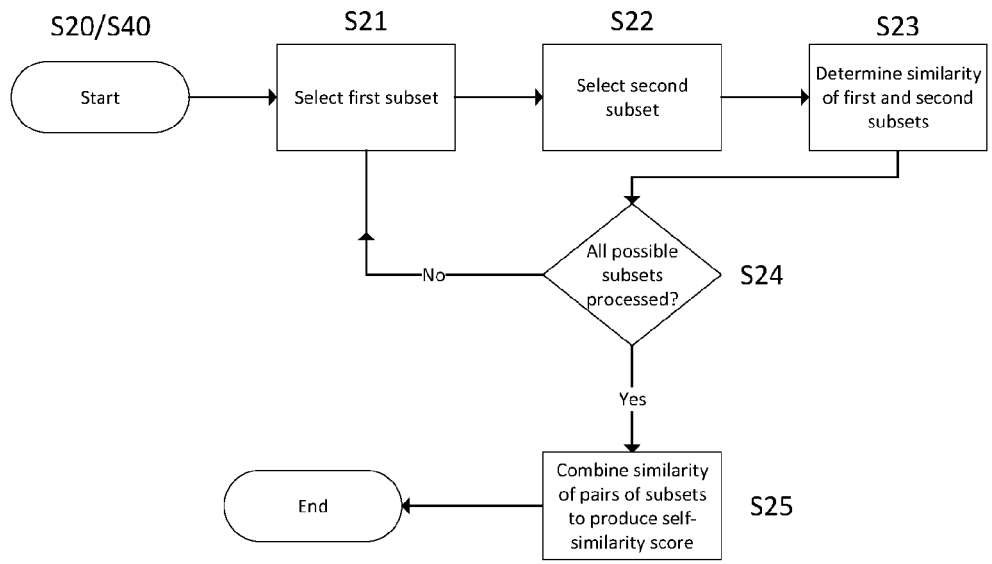
FIG. 9 is a flow chart illustrating further details of steps in the method of FIG. 8.

In an embodiment, an example of which is illustrated in FIG. 9, the self-similarity is determined by selecting in step S21 a first subset of C positions of light emitting units 6 from the set of positions, where C is a positive integer, selecting a second subset in step S22 of C positions of light emitting units 6 from the set of positions, and determining in step S23 a similarity of the two subsets. In an embodiment, such as that of FIG. 9, this is repeated for every possible subset of C positions. Thereby, a similarity of each possible subset to every other possible subset is determined. In an embodiment, the process of determining self-similarity is also repeated for two or more values of C. In an embodiment, the first and second subsets are different.

In an embodiment, the similarity of a pair of subsets is determined by performing a least-squares fit of the positions in one subset to the positions in the other subset by rotating and translating one of the subsets relative to the other. The least-squares fitting minimises the difference between one subset and the other subset. In an embodiment, the least-squares optimisation is performed by minimising the sum of the squares of the distances between positions in the first subset and corresponding positions in the second subset. In an embodiment, the least-squares fitting is performed using a Levenberg-Marquardt algorithm. Having performed the least-squares fitting, a relative position of the two subsets is obtained in which the positions of the light emitting units 6 in the two subsets are most similar.

A similarity score of the two subsets is then calculated by taking the maximum absolute distance over corresponding point-pairs. In an embodiment, the maximum absolute distance is determined by calculating the absolute distance between each position in one subset, and the corresponding position in the other subset. This produces a set of C distances, given subsets of C positions. In an embodiment, the similarity score of the two subsets is the largest of the distances in the set of distances. In another embodiment, other methods may be used to combine the distances, for example using an average of the distances. In an embodiment, corresponding positions are positions of the same light emitting unit 6 in the two subsets. In another embodiment, corresponding positions in the two subsets are the positions which are most similar between the two subsets, i.e. a position in one subset, and the position closest to that position in the second subset.

In an embodiment, as illustrated in FIG. 9, the similarity of one or more pairs of subsets of the set of positions are combined in step S25 to produce a self-similarity score for the set of positions. In an embodiment, the self-similarity score of the set of positions is the smallest of the similarity scores determined for subsets of the set of positions. Therefore the self-similarity score of the set of positions is determined by the most similar pair of subsets of the set of positions, and a lower self-similarity score indicates a more self-similar set of positions.

Once the self-similarity of each of the initial and perturbed set of positions is known, a choice is made about which set of positions to select as the initial set for the next iteration. This means the perturbation to the initial set of positions is either rejected or accepted. If it is accepted, the perturbed set of positions forms the initial set of the next repetition. The perturbed set is then further perturbed, and the process repeats. If it is rejected, the initial set of positions is unchanged between the present repetition and the following repetition. A different perturbation of the initial set will be performed, and the method will continue.

The choice of which of the initial and perturbed sets forms the new initial set is based on a comparison of the self-similarity of the initial and perturbed sets of positions. In an embodiment, this comprises comparing the determined self-similarity scores. This allows the method to produce configurations which are less self-similar. An example of choosing one of the initial and perturbed sets is shown in FIG. 10.

In an embodiment, the perturbed set of positions is chosen in step S54 if the self-similarity of the perturbed set of positions is less than or equal to the self-similarity of the initial set of positions. Therefore a change is always accepted if it reduces the self-similarity of the arrangement of light emitters 6. In an embodiment, this is achieved by choosing the perturbed set of positions if its self-similarity score is higher than or equal to the self-similarity score of the initial set of positions, as a higher self-similarity score indicates a less self-similar set of positions.

Figure 10:
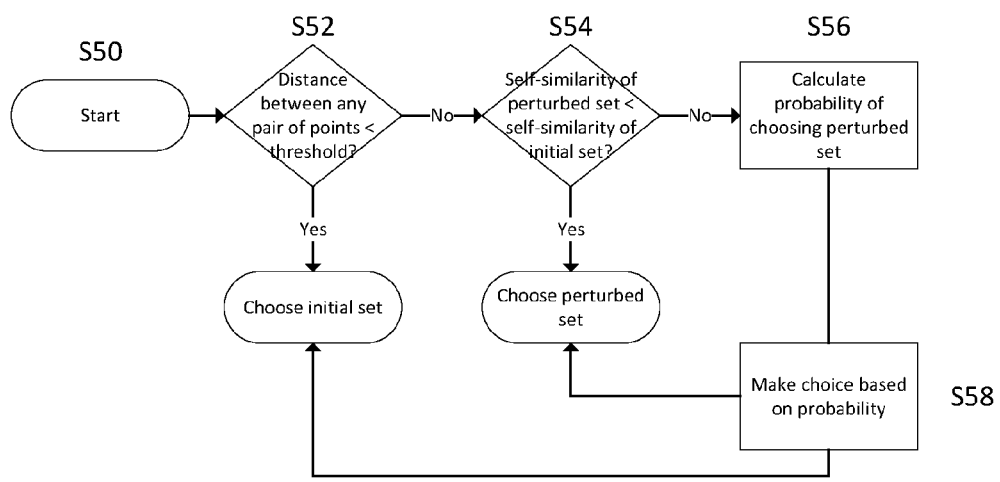
FIG. 10 is a flow chart illustrating further details of a decision step in the method of FIG. 8.

In an embodiment, an example of which is shown in FIG. 10, if the self-similarity of the perturbed set of positions is greater than the self-similarity of the initial set of positions, the perturbed set of positions is chosen in step S58 with a probability calculated in step S56 that is dependent on the difference between the self-similarity of the initial set of positions and the self-similarity of the perturbed set of positions. This means that a change may be accepted even it causes an increase in self-similarity. This allows the method to sample a larger variety of arrangements, and helps to reduce the chance that the optimisation produces an arrangement with a local minimum of self-similarity, rather than the global minimum.

In an embodiment, a simulated annealing procedure is used, where the probability of choosing the perturbed set of positions reduces as the number of repetitions increases. This means that a larger variety of arrangements can be sampled by making some potentially unfavourable changes early in the process, and then a particular arrangement optimised by only making improvements later in the process.

In an embodiment, the probability of choosing the perturbed set of positions is calculated using the function $$P = \exp\left(-\frac{\alpha(D_p - D_i)}{T}\right),$$

where P is the probability of choosing the perturbed set of positions, $D_p$ is a dissimilarity score of the perturbed set of positions, $D_i$ is a dissimilarity score of the initial set of positions, $\alpha$ is a pre-determined parameter, and T is a temperature parameter. In an embodiment, the dissimilarity scores are determined from the self-similarity scores. In an embodiment, the dissimilarity scores are such that a lower dissimilarity score indicates a lower self-similarity. Therefore in such an embodiment it is desirable to minimise the dissimilarity score. In an embodiment, the temperature parameter T is reduced as the method progresses. This reduces the probability of a change being accepted if the self-similarity of the perturbed set is higher than the self-similarity of the initial set.

In an embodiment, such as that illustrated in FIG. 10, the initial set of positions is chosen in step S52 if the distance between any pair of positions in the perturbed set of positions is below a predetermined threshold. As discussed above in relation to choosing the initial set of positions, this ensures that every pair of light emitters can be resolved as two separate light emitters 6. The method will never accept a change if it results in a pair of light emitters being potentially unresolvable.

In an embodiment, the predetermined end condition is satisfied if the self-similarity of the initial set of positions is below a predetermined threshold. This means that a desired level of self-similarity can be set, and the method will continue until the target is reached.

In an embodiment, the predetermined end condition is satisfied if a change in the self-similarity of the initial set of positions is below a predetermined threshold for a predetermined number of repetitions. Therefore, if no further improvement is made in the self-similarity of the arrangement for a number of repetitions, the process can be terminated. This would indicate that a minimum value of self-similarity has been obtained.

In an embodiment, the predetermined end condition is satisfied if a predetermined number of repetitions have been performed. This prevents the process continuing indefinitely.

In an embodiment, the method further comprises outputting the current initial set of positions if the predetermined end condition is satisfied. In an embodiment, the positions are output as a set of three-dimensional coordinates. In an embodiment, the method outputs a three-dimensional model of the mounting surface including the positions of the light emitters. This could allow designs such as a working drawing to be quickly and easily produced so that the device can be manufactured.

In an embodiment, a method of manufacturing is provided comprising designing an active marker device 2 using the method described above, and then manufacturing the active marker device 2. The step of manufacturing the active marker device 2 may comprise further design steps, for example determining a placement of components other than the light emitting units.

The invention claimed is:

1. An active marker device for use in a motion tracking system comprising:
    a mounting body comprising a mounting surface, and configured to be secured to or shaped as an object to be tracked;
    at least four light emitting units, each light emitting unit being mounted on a respective mounting portion of the mounting surface; and
    a control system configured to control the emission of light by the plurality of light emitting units, wherein the control system is configured to select a subset of at least three of the light emitting units, and control the plurality of light emitting units such that light is emitted simultaneously from the selected subset of light emitting units while the remaining light emitting units do not emit light; wherein
    an arrangement of the light emitting units on the mounting surface is such that a spatial pattern formed by the selected subset of light emitting units is distinguishable from a spatial pattern formed by any other possible subset of at least three light emitting units for all possible translations and rotations of the device.

2. The device of claim 1, wherein the pattern formed by the selected subset of light emitting units is distinguishable from itself under all possible translations or rotations of the device.

3. The device of claim 1, wherein the arrangement of the light emitting units on the mounting surface has fewer than three symmetries.

4. The device of claim 1, wherein the arrangement of the light emitting units on the mounting surface has no reflection symmetry other than the identity.

5. The device of claim 1, wherein the control system is configured to select the subset of light emitting units such that a spatial pattern formed by the selected subset has no reflection symmetry other than the identity.

6. The device of claim 1, wherein the control system is configured to select the subset of light emitting units such that a spatial pattern formed by the selected subset has no rotation symmetry other than the identity.

7. The device of claim 1, wherein the number of light emitting units and the arrangement of the light emitting units on the mounting surface is such that at least 5 different spatial patterns can be formed by subsets of at least three light emitting units.

* * * * *